United States Patent [19]

Ma

[11] Patent Number: 5,144,409
[45] Date of Patent: Sep. 1, 1992

[54] ISOTOPICALLY ENRICHED SEMICONDUCTOR DEVICES

[75] Inventor: Tso-Ping Ma, Branford, Conn.

[73] Assignee: Yale University, New Haven, Conn.

[21] Appl. No.: 615,425

[22] Filed: Nov. 16, 1990

Related U.S. Application Data

[63] Continuation of Ser. No. 577,526, Sep. 5, 1990, abandoned.

[51] Int. Cl.$^5$ .................. H01L 29/161; H01L 27/14; H01L 27/02
[52] U.S. Cl. ........................................ 357/61; 357/16; 357/30; 357/40; 357/43; 357/85
[58] Field of Search ........................ 357/43, 91, 16, 30, 357/40, 61, 85

[56] References Cited

U.S. PATENT DOCUMENTS

| | | | |
|---|---|---|---|
| 4,628,341 | 12/1986 | Thomas | 357/43 |
| 4,721,684 | 6/1988 | Musumeci | 357/43 |

FOREIGN PATENT DOCUMENTS

| | | |
|---|---|---|
| 55-93256 | 8/1980 | Japan . |
| 61-274322 | 12/1986 | Japan . |
| 63-269573 | 11/1988 | Japan . |

OTHER PUBLICATIONS

T. H. Geballe et al., "Isotopic and Other Types of Thermal Resistance in Germanium", *Physical Review*, vol. 110, 1958, pp. 773-775.

G. A. Slack, "Effect of Isotopes on Low-Temperature Thermal Conductivity", *Physical Review*, vol. 105, No. 3, 1957, pp. 829-831.

M. W. Browne, "G. E. Sees Breakthroughs From New Diamond", *The New York Times*, Jul. 11, 1990, p. D6.

T. R. Anthony et al., "Thermal Diffusivity of Isotopically Enriched $^{12}C$ Diamond", *Physical Review B*, vol. 42, No. 2, Jul., 1990, pp. 1104-1110.

*Primary Examiner*—J. Carroll
*Attorney, Agent, or Firm*—Fish & Richardson

[57] ABSTRACT

A semiconductor structure including a single-crystal region composed of an isotopically enriched semiconductor material, and a semiconductor device formed in the isotopically enriched semiconductor region.

25 Claims, 2 Drawing Sheets

ISOTOPICALLY ENRICHED SEMICONDUCTOR DEVICES

BACKGROUND OF THE INVENTION

This is a continuation-in-part of application Ser. No. 07/577,526, filed Sep. 5, 1990 abandoned.

The invention relates to semiconductor devices fabricated from semiconductor materials, such as silicon.

Silicon, an abundantly available element in nature, has become one of the most commonly used materials for fabricating electrical and electro-optical devices. In its naturally occurring form, silicon is primarily composed of three isotopes of silicon, namely, 92.2% $^{28}Si$, 4.7% $^{29}Si$, and 3.1% $^{30}Si$, which is also roughly the composition of the silicon crystals used by the silicon device industry. Due to its many desirable properties, in comparison to other semiconductors, not the least of which is the ability to easily grow $SiO_2$ insulation layers on it, silicon has provided the foundation upon which a semiconductor industry has been built.

Devices fabricated on single-crystal silicon have performance characteristics that are governed by the electrical and physical properties of the silicon itself. Some of the important properties of the single-crystal silicon which affect device characteristics are carrier mobilities, energy band gap, effective mass of the carriers, and thermal conductivity. Carrier mobilities, for example, govern signal transit times and thus place a limit on device speed. Thermal conductivity, on the other hand, governs power dissipation which, in turn, places an upper limit on the packing densities achievable for devices on a chip or the amount of power that can safely be generated in the circuit without significantly degrading circuit performance.

As engineers push the performance of the silicon-based devices, the electrical and physical properties of the silicon often place serious limits on what is ultimately achievable from such devices. For example, as signals and data communications advanced into the higher reaches of the frequency domain, the speed limitations inherent in silicon-based devices caused engineers to shift from silicon to other semiconductor materials, such as GaAs, which exhibit substantially higher carrier mobilities and thus are capable of performance at higher frequencies. The electron mobility in GaAs is over five times greater than that the carrier mobilities typically associated with silicon. This shift to GaAs was felt necessary in spite of the greater technological difficulties associated with fabricating devices from GaAs as compared to silicon. For example, it is appreciably more difficult to grow single-crystal GaAs and to form useful insulating layers on the GaAs.

SUMMARY OF THE INVENTION

In general, in one aspect, the invention is a semiconductor structure including a single-crystal region composed of an isotopically enriched semiconductor material, and a semiconductor device formed in the isotopically enriched semiconductor region.

Preferred embodiments include the following features. The semiconductor structure also includes a substrate and the isotopically enriched semiconductor region is formed as a layer on one surface of the substrate. The semiconductor material is selected from among the group consisting of silicon, germanium and GaAs. In the case of silicon, the silicon region has a higher proportion of one of the isotopes of Si than is present in naturally occurring silicon (e.g., it is composed of at least 98% $^{28}Si$). In the case of germanium, the germanium region has a higher proportion of one of the isotopes of Ge than is present in naturally occurring germanium (e.g., it is composed of at least 98% $^{74}Ge$) In the case of GaAs, the gallium in the GaAs region has a higher proportion of one of the isotopes of Ga than is present in naturally occurring gallium (e.g., it is composed of at least 98% $^{69}Ga$).

Also in preferred embodiments, the semiconductor device is either an electro-optical device or an optoelectronic device. The semiconductor structure further includes an integrated circuit fabricated in the isotopically enriched semiconductor region. The isotopically enriched semiconductor region primarily serves to provide heat dissipation for the device.

In general, in another aspect, the invention is a method for fabricating a semiconductor structure including the steps of forming a single-crystal region composed of isotopically enriched semiconductor material, and fabricating a semiconductor device in the isotopically enriched region.

Preferred embodiments include the following features. The isotopically enriched semiconductor region is formed as a layer on one surface of a substrate by means of epitaxial deposition. The semiconductor material is selected from a group consisting of silicon, germanium and GaAs. In the case of silicon, the silicon region has a higher proportion of one of the isotopes of Si than is present in naturally occurring silicon (e.g., it is composed of at least 98% $^{28}Si$). In the case of germanium, the germanium region has a higher proportion of one of the isotopes of Ge than is present in naturally occurring germanium (e.g., it is composed of at least 98% $^{74}Ge$). In the case of GaAs, the gallium in the GaAs region has a higher proportion of one of the isotopes of Ga than is present in naturally occurring gallium (e.g., it is composed of at least 98% $^{69}Ga$).

In yet another aspect, the invention is a semiconductor structure including an isotopically enriched single-crystal silicon region composed of at least 98% $^{28}Si$. The semiconductor structure also includes a substrate and the isotopically enriched silicon region is formed on one surface of the substrate.

In still another aspect, the invention is a semiconductor structure including an isotopically enriched single-crystal GaAs region in which the gallium is composed of at least 98% $^{69}Ga$. The semiconductor structure also includes a substrate and the isotopically enriched GaAs region is formed on one surface of the substrate.

Isotopically enriched single-crystal silicon will exhibit significantly higher carrier mobilities and thermal conductivity than single-crystal silicon made from the sources of naturally occurring silicon. Higher carrier mobilities mean that devices fabricated from the isotopically enriched silicon will exhibit faster device speeds and higher frequency performance than was previously possible using conventional compositions of silicon. Higher carrier mobilities also imply lower resistivity and thus lower heat generation within the material. In addition, higher thermal conductivity means that the isotopically enriched silicon devices will exhibit better heat dissipation, thereby making it possible to increase device packing densities within integrated circuit chips and to increase power output per unit area of power devices. Furthermore, the invention has applicability in device structures, such as, semiconductor laser arrays, which utilize silicon substrates or silicon layers primarily for heat dissipation. Using the invention in those cases will improve the thermal performance of the devices and also make higher packing densities possible.

The same principles and advantages also apply to other semiconductor materials such as Ge and GaAs. That is, isotopically enriched versions of those materials will exhibit higher carrier mobilities and higher thermal conductivities. As in the case of isotopically enriched silicon, using such isotopically enriched semiconductors for device fabrication will produce devices which exhibit improved performance in ways which relate to the higher carrier mobilities and higher thermal conductivities.

Other advantages and features will become apparent from the following description of the preferred embodiment and from the claims.

DESCRIPTION OF THE PREFERRED EMBODIMENT

STRUCTURE

Figure 1:
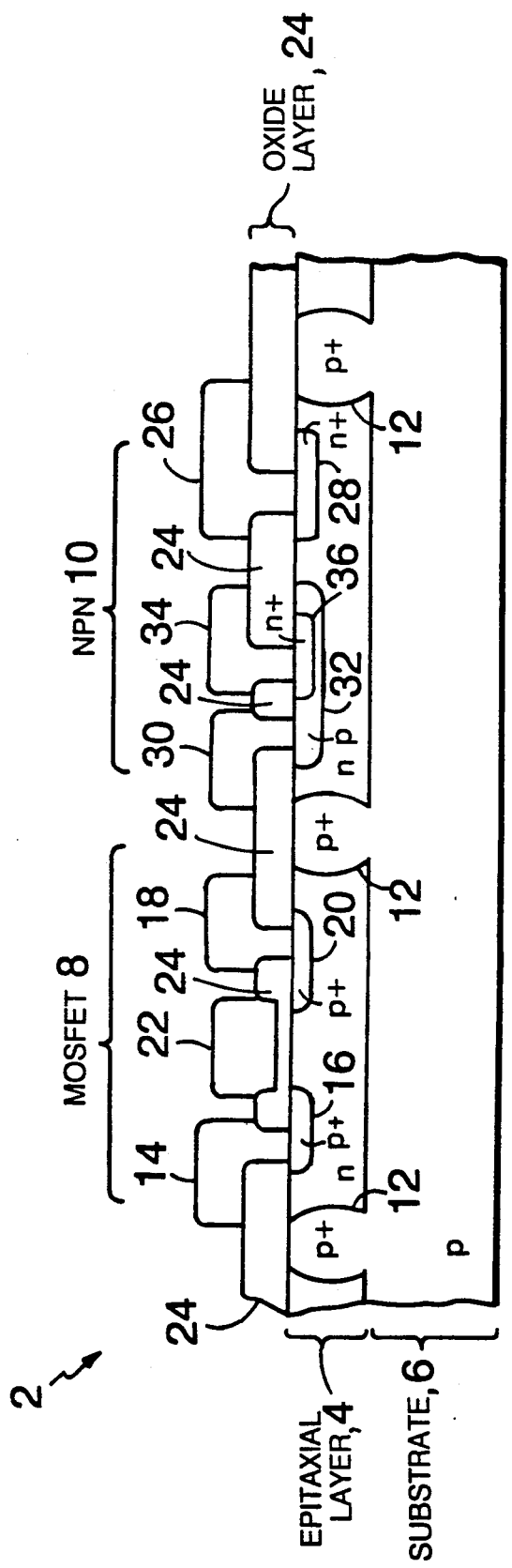
FIG. 1 is a cross-section of a representational portion of wafer on which an integrated circuit is fabricated.

Referring to FIG. 1, integrated circuit 2 is fabricated in an n-type epitaxial layer 4 that is formed on one side of a p-type silicon substrate 6. N-type epitaxial layer 4 is a single-crystal silicon layer composed of isotopically enriched silicon in which the percentage of $^{28}Si$ is greater than the percentage of that isotope typically found in naturally occurring sources of silicon. More specifically, the percentage of $^{28}Si$ is greater than at least 94% and more preferably is greater than 98%, with the aggregate of other isotopes of silicon, namely, $^{29}Si$ and $^{30}Si$, being reduced accordingly. In addition, in this application, a material is defined to be single-crystal if it has single-crystal structure over a distance that is larger than the dimensions of the devices that are or will be fabricated using that silicon material The illustrated portion of integrated circuit 2 includes a metal-oxide-semiconductor field effect transistor (MOSFET) 8 and an NPN bipolar transistor 10, each of which is isolated from the other and from other devices on the chip by $p^+$-type regions 12 that are diffused through epitaxial layer 4 into substrate 6. MOSFET 8 is a conventionally designed device including a drain metallization 14 in contact with a $p^+$-type drain region 16, a source metallization 18 in contact with a $p^+$-type source region 20 and a gate metallization 22 isolated from electrical contact with epitaxial layer 4 by a $SiO_2$ layer 24.

NPN transistor 10 is also of conventional design and includes a collector metallization 26 in contact with an $n^+$-type region 28, a base metallization 30 in contact with a p-type base region 32 and an emitter metallization 34 in contact with an $n^+$-type emitter region 36.

With the exception of epitaxial layer 4, integrated circuit 2, including MOSFET 8 and NPN 10, may be produced by any of the device fabrication techniques familiar to those skilled in the art and with any of the materials commonly used to fabricate such circuits. These techniques include, for example, diffusion, ion implantation, and other well known particle beam techniques. For further discussion of such techniques, see, for example, C. W. Pearce in Chapter 2 of *VLSI Technology*, edited by S. M. Sze and published by McGraw-Hill, 1983; W. R. Runyan and K. E. Bean in Chapter 7 of *Semiconductor Integrated Circuit Processing Technology*, published by Addison-Wesley, 1990; and J. W. Mayor and S. S. Lau in Chapter 8 of *Electronic Materials Science for Integrated Circuits in Si and GaAs*, published by MacMillian, 1990.

Except for the fact that an isotopically enriched silicon source is used, epitaxial layer 4 may also be formed by using any of the epitaxial techniques known to those skilled in the art, including, for example, chemical vapor deposition (CVD), high vacuum CVD, molecular beam epitaxy (MBE), implantation/recrystallization, and RF sputtering. Unless isotope enrichment is built into the epitaxial process, the percentage of $^{28}Si$ in the silicon source material should, of course, be equal to whatever proportion of that isotope is desired in epitaxial layer 4. Thus, to form an epitaxial layer having 98% $^{28}Si$, one should use a source in which $^{28}Si$ is present in that proportion. Such isotopically enriched silicon sources can be obtained from commercial suppliers such as, for example, Oak Ridge National Laboratories in Oak Ridge, Tenn. or Atomergic Chemetals in Farmingdale, N.Y.

The appropriate form of the source material, i.e., whether it is powdered, gaseous or liquid, depends upon the technique being used to grow the epitaxial layer. Thus, for example, if MBE is used, a powdered or solid bulk source of isotopically enriched silicon is appropriate. Whereas, if a CVD process is used, a gaseous source such as, for example, silane, disilane or silicon tetrachloride, would be more appropriate. If the isotopically enriched silicon is obtained in powdered or solid form, any of the other forms can readily be produced using known techniques.

Figure 2:
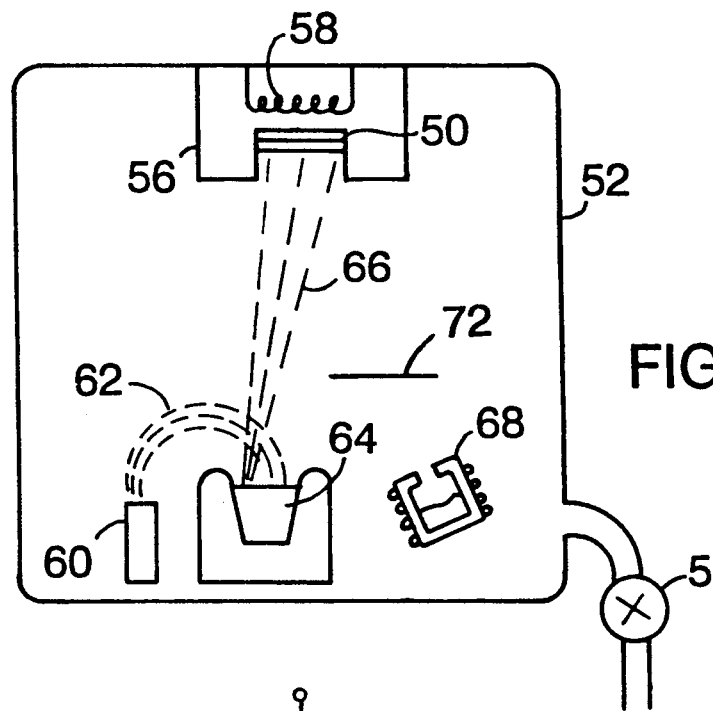
FIG. 2 is a schematic representation of a molecular beam epitaxy system for depositing a layer of isotopically enriched silicon.

FIG. 2 illustrates the basic components of an MBE system for growing an epitaxial layer of isotopically enriched silicon on a silicon substrate 50. The system includes a chamber 52 connected to a vacuum pump 54 which establishes the required vacuum in chamber 52. Inside chamber 52, a support 56 holds silicon substrate 50 that is heated by a heating element 58 to an appropriate temperature for MBE. An electron beam gun 60 generates an e-beam 62 that heats up and vaporizes a source 64 of isotopically enriched silicon 60, thereby generating a molecular beam 66 of silicon that deposits an epitaxial layer on substrate 50. A dopant effusion cell 68 may be used to introduce a dopant into the epitaxial layer as it is being grown. The supply of dopant from effusion cell 68 is controlled by a mechanical shutter 72.

The deposition process is continued until an epitaxial layer of desired thickness is achieved, e.g. 2–3 microns for power devices or sub-micron thicknesses for high frequency devices. The operating parameters during deposition such as chamber pressure, the temperature of substrate 50, the temperature of effusion cell 68, the dopant source material used in effusion cell 68 and the duration of the growth cycle may be the same as those which are commonly used to deposit epitaxial layers of ordinary silicon and are well known to those skilled in the art.

During the deposition of the isotopically enriched silicon layer, precautions must be taken to assure that isotopes of silicon other than $^{28}Si$ are not introduced into the epitaxial layer. For example, silicon from quartz tubes or containers used in the deposition system could be a source of such contamination if they are permitted to get too hot.

If the epitaxial layer is grown by ion implantation, it may not be necessary to use a source of isotopically enriched silicon. A mass separator could be used in the ion implantation equipment to select the $^{28}$Si from the ion stream and to exclude the other isotopes of silicon. Ion implantation techniques, however, typically generate amorphous layers which must recrystallized by using a high temperature anneal. Since the recrystallization may not eliminate all of the defects in the epitaxial layer, the benefits of using an isotopically enriched layer (i.e. the improved carrier mobilities and the thermal conductivities) could be masked by these residual defects.

Other embodiments are within the following claims. For example, it should be understood that the above example of an integrated circuit was merely illustrative. Although only a MOSFET and an NPN transistor were shown, the invention described herein has applicability to all electronic devices made using single-crystal silicon for which improved carrier mobility and/or improved thermal conductivity would provide a desired benefit. In this case, electronic devices is meant to include both passive devices (e.g., resistors) and active devices (e.g., transistors). The invention also has applicability to particular categories of semiconductor devices such as electro-optical devices including, for example, deflectors and modulators, and opto-electronic devices including, for example, lasers.

In addition, rather than using epitaxial layers made of isotopically enriched silicon, wafers made entirely of isotopically enriched silicon may be used. Such wafers may be cut from single-crystal silicon grown from a source of isotopically enriched silicon by any of the known crystal growing techniques, including, for example, the commonly used Czochralski technique.

In addition, isotopically enriched silicon can be used to replace materials currently used to provide heat sinking in some semiconductor devices such as, for example, semiconductor laser arrays.

Other embodiments use other isotopically enriched semiconductor materials, such as, Ge, Ge-Si, and GaAs. As with isotopically enriched silicon, such other isotopically enriched semiconductors will exhibit improved carrier mobilities and thermal conductivity. If such materials are used for device fabrication, the resulting devices will exhibit improvements in device performance corresponding to the higher carrier mobilities and thermal conductivities.

In its naturally occurring form, germanium is composed of about 7.8% $^{76}$Ge, 36.5% $^{74}$Ge, 7.8% $^{73}$Ge, 27.5% $^{72}$Ge, and 20.5% $^{70}$Ge. Whereas, gallium in its naturally occurring form is composed of about 60.4% $^{69}$Ga and 39.6% $^{71}$Ga. Isotopically enriched forms of these materials include any composition in which the percentage of one isotope is increased in comparison to all other isotopes. Reducing the presence of other isotopes (i.e., increasing the isotopic purity of he material) will increase both the carrier mobilities and thermal conductivity of the resulting material. In general, it is desirable to use isotopically enriched material in which the other isotopes represent less than 6%, and more preferably, less than 2% of the composition. Thus, for example, isotopically enriched germanium for use in device fabrication might include more than 94% $^{74}$Ge and less than 6% of the other isotopes of Ge. Similarly, isotopically enriched gallium in GaAs that is used for device fabrication might include more than 94% $^{69}$Ga and less than 6% of $^{71}$Ga.

In the above examples, the isotope that was present in the naturally occurring semiconductor in the greatest proportions was selected as the dominant one in the enriched material. Note, however, that the objective is to reduce the presence all but one isotope. Therefore, any of the isotopes could be selected as the dominant isotope in the enriched material.

As with silicon, other isotopically enriched source material (i.e., powdered semiconductor material) can also be obtained from commercial suppliers who may use known techniques to produce the material. Once the isotopically enriched source material is obtained, devices may be fabricated from it by using any of the commonly known device fabrication technologies that are currently used to produce devices from the naturally occurring compositions of the semiconductor materials. In addition to the technologies already mentioned for silicon, examples of commonly used fabrication technologies for GaAs and germanium include molecular beam epitaxy (MBE) and organometallic chemical vapor deposition (OMCVD).

Figure 3:
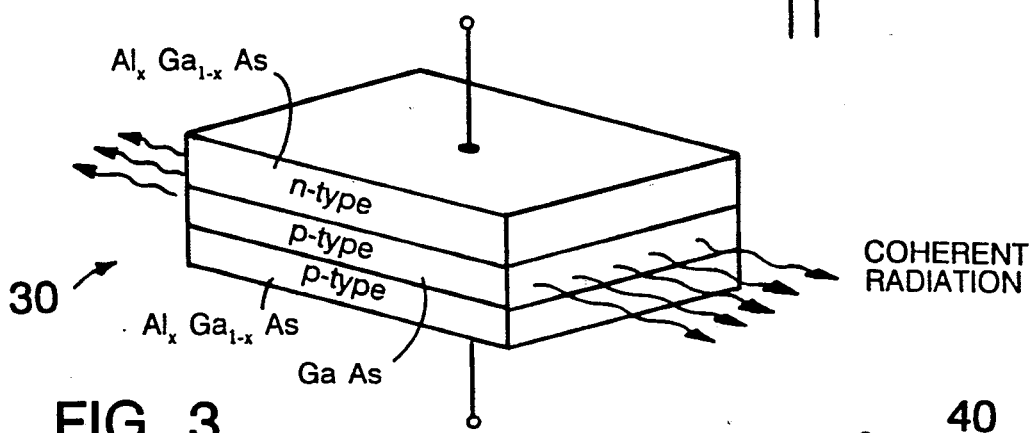
FIG. 3 is a double-heterostructure laser made from isotopically enriched GaAs.
Figure 4:
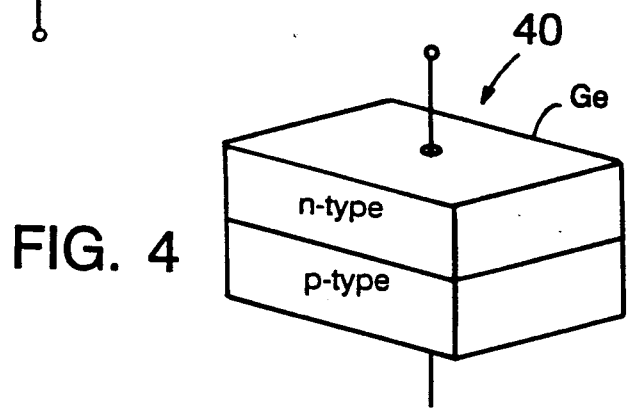
FIG. 4 is a diode made from isotopically enriched Ge.

The devices which may be constructed using the isotopically enriched semiconductor materials include all of the devices currently being fabricated using the naturally occurring semiconductor materials. For example, GaAs has commonly been used to build lasers (i.e., opto-electronic devices) such as the double-heterostructure laser 30 shown in FIG. 3, MESFET's (metal-semiconductor field effect transistors), and schottky devices and germanium has been used alone to construct germanium a variety of junction devices, such as diode 40 in FIG. 4, and in combination with silicon to construct multilayer Si-Ge structures. Using isotopically enriched semiconductors in these applications will improve those aspects of device performance related to the higher carrier mobilities and the higher thermal conductivities of the enriched materials.

What is claimed is:

1. A semiconductor structure comprising:
   a single-crystal region composed of an isotopically enriched silicon having a higher proportion of the $^{28}$Si isotope than is present in naturally occurring silicon; and
   a semiconductor device formed within said isotopically enriched single-crystal region.

2. The semiconductor structure of claim 1 further comprising a substrate and wherein said isotopically enriched semiconductor region is formed on one surface of said substrate.

3. The semiconductor structure of claim 2 wherein said isotopically enriched semiconductor region is a layer formed on one surface of said substrate.

4. The semiconductor structure of claim 1 wherein said single-crystal region is composed of at least 94% $^{28}$Si.

5. The semiconductor structure of claim 4 wherein said single-crystal region is composed of at least 98% $^{28}$Si.

6. The semiconductor structure of claim 1 wherein said isotopically enriched silicon exhibits higher carrier mobilities and/or thermal conductivity in comparison to naturally occurring forms of silicon and wherein said semiconductor device exhibits improved device performance due to said higher carrier mobilities and/or thermal conductivity.

7. A semiconductor structure comprising a single-crystal GaAs region wherein the gallium in said GaAs region is composed of at least 94% of one of the isotopes of Ga.

8. The semiconductor structure of claim 7 further comprising a substrate and wherein said single-crystal GaAs region is formed on one surface of said substrate.

9. The semiconductor structure of claim 7 or 8 wherein the gallium in said single-crystal GaAs region is composed of at least 94% of $^{69}$Ga.

10. The semiconductor structure of claim 9 wherein the proportion of $^{69}$Ga in the gallium in said single-crystal GaAs region is no less than 98%.

11. A semiconductor structure comprising:
a single-crystal region composed of an isotopically enriched germanium; and
a semiconductor device formed by using said isotopically enriched region.

12. The semiconductor structure of claim 11 wherein said single-crystal region has a higher proportion of one of the isotopes of Ge than is present in naturally occurring germanium.

13. The semiconductor structure of claim 12 wherein said single-crystal region has a higher proportion of the $^{74}$Ge isotope than is present in naturally occurring germanium.

14. The semiconductor structure of claim 13 wherein said single-crystal region is composed of at least 94% $^{74}$Ge.

15. The semiconductor structure of claim 14 wherein said single-crystal region is composed of at least 98% $^{74}$Ge.

16. A semiconductor structure comprising:
a single-crystal region composed of an isotopically enriched GaAS; and
a semiconductor device formed by using said isotopically enriched region.

17. The semiconductor structure of claim 16 wherein the gallium in said single-crystal region has a higher proportion of one of the isotopes of Ga than is present in naturally occurring gallium.

18. The semiconductor structure of claim 17 wherein the gallium in said single-crystal region has a higher proportion of the $^{69}$Ga isotope than is present in naturally occurring germanium.

19. The semiconductor structure of claim 18 wherein the gallium in said single-crystal region is composed of at least 94% $^{69}$Ga.

20. The semiconductor structure of claim 19 wherein said gallium in said single-crystal region is composed of at least 98% $^{69}$Ga.

21. The semiconductor structure of claim 1, 11, or 16 wherein the semiconductor device is an electronic device.

22. The semiconductor structure of claim 1, 11, or 16 wherein the semiconductor device is an electro-optical device.

23. The semiconductor structure of claim 1, 11, or 16 wherein the semiconductor device is an opto-electronic device.

24. The semiconductor structure of claim 1, 11, or 16 further comprising an integrated circuit fabricated in the isotopically enriched semiconductor region.

25. The semiconductor structure of claim 1, 11, or 16 wherein said isotopically enriched semiconductor region primarily serves to provide heat dissipation for said device.

* * * * *

UNITED STATES PATENT AND TRADEMARK OFFICE
CERTIFICATE OF CORRECTION

PATENT NO. : 5,144,409
DATED : September 1, 1992
INVENTOR(S) : Tso-Ping Ma

It is certified that error appears in the above-indentified patent and that said Letters Patent is hereby corrected as shown below:

On title page, item [63] Related U.S. Application Data, "Continuation" should read --Continuation-in-part--.

Item [56] References Cited (Foreign Patent Documents); "55-93256 8/1980 Japan" should read --55-93256 7/1980 Japan--.

Col. 2, line 5, insert --.-- after "$^{74}$Ge)".

Col. 5, line 11, insert --be-- after "must".

Col. 5, line 61, "he" should read --the--.

Col. 6, line 9, insert --of-- after "presence".

Col. 6, line 36, delete "germanium".

Col. 8, line 2, claim 16, "GaAS" should read --GaAs--.

Signed and Sealed this

Seventh Day of December, 1993

*Attest:*

BRUCE LEHMAN

*Attesting Officer*  *Commissioner of Patents and Trademarks*